United States Patent
Grübler

(10) Patent No.: US 11,902,697 B2
(45) Date of Patent: Feb. 13, 2024

(54) UNCOOLED THERMAL IMAGER

(71) Applicant: OroraTech GmbH, Munich (DE)

(72) Inventor: Thomas Grübler, Munich (DE)

(73) Assignee: OroraTech GmbH, Munich (DE)

( * ) Notice: Subject to any disclaimer, the term of this patent is extended or adjusted under 35 U.S.C. 154(b) by 403 days.

(21) Appl. No.: 17/420,513

(22) PCT Filed: Dec. 20, 2019

(86) PCT No.: PCT/EP2019/086610
§ 371 (c)(1),
(2) Date: Jul. 2, 2021

(87) PCT Pub. No.: WO2020/141102
PCT Pub. Date: Jul. 9, 2020

(65) Prior Publication Data
US 2022/0086371 A1     Mar. 17, 2022

(30) Foreign Application Priority Data
Jan. 3, 2019  (EP) ...................... 19150221

(51) Int. Cl.
*H04N 5/33*       (2023.01)
*B64G 1/10*       (2006.01)
(Continued)

(52) U.S. Cl.
CPC ................. *H04N 5/33* (2013.01); *B64G 1/10* (2013.01); *B64G 1/66* (2013.01); *H10N 19/00* (2023.02); *H04N 13/243* (2018.05)

(58) Field of Classification Search
CPC ........ H04N 5/33; H04N 13/246; H10N 19/00; B64G 1/10; B64G 1/66
See application file for complete search history.

(56) References Cited

U.S. PATENT DOCUMENTS

| 2014/0211006 A1 | 7/2014 | Tulet et al. | |
| 2014/0374602 A1* | 12/2014 | Falcone | ................. H01L 31/16 |
| | | | 250/341.1 |

(Continued)

OTHER PUBLICATIONS

International Search Report for Application No. PCT/EP2019/086610 dated May 26, 2020, 26 pgs.

(Continued)

*Primary Examiner* — Mishawn N. Hunter
(74) *Attorney, Agent, or Firm* — Seed IP Law Group LLP

(57) ABSTRACT

A multispectral or thermal imager comprising a lens assembly, an array of IC chips that is arranged in a field of view of the lens assembly, each IC chip comprising an array of thermopile devices, and a filter assembly comprising one or more wavelength filters. The filter assembly comprises a respective wavelength filter for at least one of the three or more rows of IC chips. At least one wavelength filter is transparent in a portion of a wavelength range that passes through the lens assembly. The filter assembly is configured such that radiation of the same wavelength range passes to the rows of IC chips in the pair of non-adjacent rows, and such that the wavelength range that passes to the rows in the pair of non-adjacent rows is different from a wavelength range that passes to the one or more rows other than the pair of non-adjacent rows.

15 Claims, 3 Drawing Sheets

(51) Int. Cl.
*B64G 1/66* (2006.01)
*H10N 19/00* (2023.01)
*H04N 13/243* (2018.01)

(56) References Cited

U.S. PATENT DOCUMENTS

| | | | |
|---|---|---|---|
| 2016/0073043 A1* | 3/2016 | Stork | G06V 40/19 |
| | | | 348/164 |
| 2019/0110047 A1* | 4/2019 | De Muynck | H04N 19/119 |
| 2019/0137331 A1* | 5/2019 | Hosaka | G01J 5/48 |

OTHER PUBLICATIONS

Davis, W.K., "Conceptual Design and Requirements Of A Pushbroom Focal Plane", Proc. SPIE 0282, Technical Issues in Focal Plane Development, Dec. 29, 1981, 6 pgs.

Rienstra, J. et al., "Multispectral focal plane assembly for satellite remove sensing", Aerospace Conference, 1998 IEEE Snowmass at Aspen, CO Mar. 21-28, 1998, pp. 233-241.

Müller, J. et al., "A novel micromachined 2x128-element linear thermoelectric infrared radiation sensor array", Proceedings of MICRO.tec 2000, VDE World Microtechnologies Congress, Hanover, Sep. 25-27, 2000, VDE Verlag, Berlin, Offenbach, vol. 1, pp. 465-469.

Rogalski, A., "Progress in focal plane array technologies", Progress in Quantum Electronics 36 (2012) 342-473.

Antensteiner, D. et al., "High-Precision 3D Sensing with Hybrid Light Field & Photometric Stereo Approach in Multi-Line Scan Framework", Society for Imaging Science and Technology, 2017, 10 pgs.

* cited by examiner

UNCOOLED THERMAL IMAGER

BACKGROUND

Technical Field

This application relates to thermal imagers, such as infrared (IR) cameras, for example. In particular, the application relates to uncooled thermal imagers, and more particularly, to uncooled thermal imagers that are suitable for use in satellites (e.g., nanosatellites, such as Cubesats), airplanes, or unmanned aerial vehicles.

Description of the Related Art

The spectral range (wavelength range) from 8 µm to 13 µm as well as 4±0.5 µm is not (or just minimally) absorbed by Earth's atmosphere and is therefore particularly suited for measuring the temperature of Earth's surface from space (e.g., from an orbit around Earth). Thus, most meteorological satellites use this spectral range for the purpose of temperature measurements.

Most thermal imagers (e.g., IR cameras) that are used in this context require active cooling. Active cooling however necessitates large power consumption and active thermal management needs to be provided to discharge the cooling power (e.g., heat from a Peltier element).

For the above reasons, it is very difficult (if not impossible) to provide nanosatellites (e.g., Cubesats) with a thermal imager. Likewise, it is difficult to provide small airplanes or small unmanned aerial vehicles with a thermal imager.

Thus, there is a need for an improved thermal imager that does not require cooling (and therefore has lower power consumption, e.g., lower by a factor of $1/10$) and/or that is more compact than conventional thermal imagers.

SUMMARY

In view of some or all of these needs, the present disclosure proposes a thermal imager, a satellite having a thermal imager, and a method of operating a thermal imager aboard a satellite, having the features of the respective independent claims.

An aspect of the disclosure relates to a thermal imager. The thermal imager may be an infrared camera, for example. The thermal imager may include a lens assembly. The lens assembly may include a first lens and a second lens arranged on a common optical axis. The lens assembly may allow passage of (thermal) radiation in a given wavelength range. Preferably, the lens assembly may be transparent in the IR range, for example for wavelengths from 8 µm-13 µm or (at least) 8 µm-12 µm. The lens assembly may additionally be transparent in a wavelength range around 4 µm or any other value between 2 µm and 20 µm. The thermal imager may further include an array of integrated circuit (IC) chips that is arranged in a field of view of the lens assembly. Each IC chip may include an array of thermopile devices. Accordingly, the array of IC chips may also be referred to as an array of arrays of thermopile devices. The array of IC chips may act as an image sensor (camera sensor). The thermal imager may further include a filter assembly comprising one or more wavelength filters. The wavelength filters may be bandpass filters, for example. The IC chips may be arranged in three or more parallel rows of IC chips that include a pair of non-adjacent rows of IC chips and one or more rows of IC chips other than the pair of non-adjacent rows of IC chips.

The pair of non-adjacent rows of IC chips may be the outer two rows of the array of IC chips. The one more rows other than the pair of non-adjacent rows of IC chips may be the intermediate (or inner) rows of the array of IC chips. The rows of IC chips may be equidistant. IC chips within each row of IC chips may be equidistant. For example, the IC chips in the array of IC chips may be arranged at the vertices of a regular rectangular grid. The filter assembly may be arranged between the array of IC chips and the lens assembly. The filter assembly may include a respective wavelength filter for at least one of the first to third rows of IC chips. The wavelength filters may be each (spatially) aligned with their respective row of IC chips (e.g., to substantially cover (only) the respective row of IC chips when seen from the lens assembly). The one or more wavelength filters may be transparent in a portion of a wavelength range of radiation that can pass through the lens assembly (and may be nontransparent in another portion of the wavelength range of radiation that can pass through the lens assembly). That is, the wavelength filters may filter (block) a portion of the wavelength range of (thermal) radiation that can pass through the lens assembly. The filter assembly may be further configured such that radiation of the same wavelength range can pass to the rows of IC chips in the pair of non-adjacent rows of IC chips, and such that the wavelength range of radiation that can pass to the rows of IC chips in the pair of non-adjacent rows of IC chips is different from a wavelength range of radiation that can pass to the one or more rows of IC chips other than the pair of non-adjacent rows of IC chips. For example, the three or more parallel rows of IC chips may include first to third rows of IC chips. The second row of IC chips may be arranged at an intermediate position between the first and third rows of IC chips. Then, the filter assembly may be further configured such that a wavelength range of radiation that can pass to the first row of IC chips is the same as a wavelength range of radiation that can pass to the third row of IC chips, and is different from a wavelength range of radiation that can pass to the second row of IC chips. Therein, the first and third rows may receive filtered radiation, while there is no filter for the second row, or vice versa. In a preferred embodiment, the array of IC chips comprises four rows of IC chips, with the pair of outer rows receiving radiation of the same wavelength range. In the above and in the remainder of this document, radiation is intended to mean thermal radiation, unless indicated otherwise.

By using thermopile arrays for building up the image sensor of the thermal imager, active cooling is not necessary. Thereby, the power consumption of the proposed thermal imager can be reduced to less than one tenth of the power consumption of conventional thermal imagers. Likewise, the absence of active cooling allows for a more compact design of the thermal imager, making it a suitable candidate for use in nanosatellites, small aircraft, or small unmanned aerial vehicles. By using an array of thermopile arrays, the proposed thermal imager allows to capture two-dimensional thermal images of Earth's surface. Since at least two rows of IC chips that are spaced apart from each other receive radiation in the same wavelength range, stereoscopic methods can be applied to thermal images captured at appropriate sample timings, to reconstruct, for example, a three-dimensional shape of clouds in the field of view of the thermal imager. Finally, by providing the proposed filter assembly, possibly together with comparing or otherwise combining readout signals (thermal images) obtained from different rows of IC chips, a thermal resolution can be achieved that is more than sufficient for the intended purpose of measuring temperatures on Earth's surface for meteorological applications.

In some embodiments, the wavelength range of radiation that can pass to the rows of IC chips in the pair of non-adjacent rows of IC chips (e.g., the first and third rows of IC chips) may span at least two thirds of the wavelength range of (thermal) radiation that can pass through the lens assembly. For example, the wavelength range of radiation that can pass to the rows of IC chips in the pair of non-adjacent rows of IC chips (e.g., the first and third rows of IC chips) may span at least 90 percent (%) of the wavelength range of radiation that can pass through the lens assembly.

In some embodiments, the wavelength range of radiation that can pass to the rows of IC chips in the pair of non-adjacent rows of IC chips (e.g., the first and third rows of IC chips) may be larger than the wavelength range of radiation that can pass to the one or more rows of IC chips other than the pair of non-adjacent rows of IC chips (e.g., the second row of IC chips) by at least 50 percent. In a preferred embodiment, the wavelength range of radiation that can pass to the rows of IC chips in the pair of non-adjacent rows of IC chips (e.g., the first and third rows of IC chips) may be larger than the wavelength range of radiation that can pass to the one or more rows of IC chips other than the pair of non-adjacent rows of IC chips (e.g., the second row of IC chips) by 100 percent (%).

In some embodiments, the wavelength range of radiation that can pass to the rows of IC chips in the pair of non-adjacent rows of IC chips (e.g., the first and third rows of IC chips) may span the full wavelength range of radiation that can pass through the lens assembly. Accordingly, radiation that can pass to the rows of IC chips in the pair of non-adjacent rows of IC chips (e.g., the first and third rows of IC chips) may not be filtered by the filter assembly (i.e., there may not be a corresponding wavelength filter for these rows of IC chips).

Accordingly, at least two rows of IC chips that are spaced apart from each other receive radiation in the same, broad, wavelength range. Readout signals (thermal images) from these rows of IC chips can therefore be used for applying stereoscopy. On the other hand, the row or rows of IC chips that receive radiation in a narrower wavelength range can be used, for example, calculating the temperature of Earth's surface.

In some embodiments, the array of IC chips may include at least two inner rows of IC chips that are arranged at respective intermediate positions between the rows of IC chips in the pair of non-adjacent rows of IC chips. For example, the array of IC chips may include, in addition to the first, second, and third rows of IC chips, a fourth row of IC chips arranged at a position between the first and third rows of IC chips. The filter assembly may comprise a respective wavelength filter for each of the at least two inner rows of IC chips (e.g., for the second and fourths rows of IC chips). Wavelength ranges of radiation that can pass through the respective wavelength filters for the at least two inner rows of IC chips (e.g., the second and fourth rows of IC chips) may be different from each other. In an ideal case, these wavelength ranges may be substantially disjoint.

Accordingly, the thermal imager comprises two rows of IC chips that receive radiation in comparatively narrow (filtered) wavelength ranges. Readout signals (thermal images) from these rows can be used for accurately calculating the temperature on Earth's surface.

In some embodiments, a wavelength range of radiation that can pass through the lens assembly may be partitioned by the wavelength filters of the filter assembly. For example, the wavelength ranges in which the wavelength filters are transparent may be substantially disjoint and may add up to the full wavelength range. If for example the full wavelength range (wavelength range of radiation that can pass through the lens assembly) is 8 µm-12 µm, the passbands of the wavelength filters for the second and fourth rows of IC chips may be 8 µm-10 µm and 10 µm-12 µm, respectively.

Providing four rows of IC chips that are sensitive in such disjoint wavelength ranges allows to accurately calculate the temperature on Earth's surface. Moreover, for disjoint wavelength ranges, additional information can be inferred by taking differences between thermal images from different rows of IC chips.

In some embodiments, the array of IC chips may be a rectangular (e.g., quadratic) or circular array. For a circular array, the rows of IC chips may have different lengths (in terms of a number of IC chips in respective rows). In general, the number of IC chips per row can be different from the number of rows of IC chips in the array of IC chips. Thereby, the shape of the thermal imager can be adapted to the enclosure in a satellite, airplane, or unmanned aerial vehicle that is intended to carry the thermal imager.

In some embodiments, the filter assembly may be arranged at a predetermined distance from the array of IC chips. The distance may be in the range from 1 mm to 10 mm, for example. The filter assembly may be spaced without contact from the array of IC chips.

In some embodiments, the thermal imager may be suitable for use in at least one of a satellite, an airplane, or an unmanned aerial vehicle. The satellite may be a nanosatellite, such as a Cubesat (e.g., 3 U Cubesat), for example. This may be seen as a direct consequence of the thermal imager not requiring active cooling, so that power consumption and size of the thermal imager can be reduced.

Another aspect of the disclosure relates to a satellite including the thermal imager according to the above aspect and any of its embodiments. The satellite may be an Earth observation satellite. Further, the satellite may be a nanosatellite, such as a Cubesat, for example.

In some embodiments, the thermal imager is arranged such that it faces Earth's surface and the rows of IC chips are oriented in perpendicular to a plane spanned by a flight direction of the satellite and a perpendicular to Earth's surface. That is, a pixel on a ground track of the satellite may be successively swept by fields of view of the rows of IC chips in the array of IC chips, from a leading row to a trailing row (e.g., from the first to third rows of IC chips (in that order)).

This allows to reasonably compare the readout signals (thermal images) from different rows of IC chips. By analyzing linear combinations of readout signals (thermal images) from different rows of IC chips (that receive radiation indifferent wavelength ranges), additional information about the temperature on Earth's surface and/or the properties of Earth's atmosphere in a field of view of the thermal imager can be obtained.

In some embodiments, a sample frequency for capturing readout signals of the array of IC chips (e.g., one readout signal per IC chip) may be set in dependence on an orbital period of the satellite and a length along the ground track of the satellite of a field of view, projected on Earth's surface, of each row of IC chips. The satellite may comprise readout circuitry for capturing the readout signals of the array of IC chips at sample timings given by the sample frequency.

In some embodiments, a sample frequency for capturing readout signals (thermal images) of the array of IC chips may be set such that a field of view, projected on Earth's surface, of a leading row of IC chips at a given sample timing substantially coincides with a field of view, projected on Earth's surface, of an n-th row of IC chips from the leading row of IC chips at an n-th sample timing subsequent to the given sample timing, where n is an integer ranging from 2 to N−1, with N the number of rows of IC chips in the array of IC chips. The N-th row of IC chips may be a trailing row of IC chips. The array of IC chips may include the N rows of IC chips from the leading row to the trailing row.

Accordingly, a pixel on Earth's surface (on the ground track of the satellite) is successively captured by each of the rows of IC chips in the array of IC chips. Comparing different thermal images of the same pixel (captured by different rows of IC chips at different sample timings) allows to infer additional information on the temperature on Earth's surface and/or on properties of the atmosphere.

In some embodiments, the satellite may further include readout circuitry for capturing the readout signals (thermal images) of the array of IC chips at respective sample timings given by the sample frequency. The readout circuitry may be configured to compare readout signals (thermal image) for one row of IC chips in the pair of non-adjacent rows of IC chips (e.g., the first row of IC chips) captured at a given sample timing to corresponding readout signals (thermal image) for the other row of IC chips in the pair of non-adjacent rows of IC chips (e.g., the third row of IC chips) captured at an m-th sample timing subsequent to the given timing, assuming that the other row of IC chips in the pair of non-adjacent rows of IC chips is the m-th row of IC chips from the one row of IC chips in the pair of non-adjacent rows of IC chips, counting all intermediate rows of IC chips.

Another aspect of the disclosure relates to a method of operating the thermal imager according to the first aspect and any of its embodiments when aboard a satellite orbiting Earth, assuming that the thermal imager is arranged such that it faces Earth's surface and the rows of IC chips are oriented in perpendicular to a plane spanned by a flight direction of the satellite and a perpendicular to Earth's surface. The method may include setting a sample frequency for capturing readout signals of the array of IC chips such that a field of view, projected on Earth's surface, of a leading row of IC chips at a given sample timing substantially coincides with a field of view, projected on Earth's surface, of an n-th row of IC chips from the leading row of IC chips at an n-th sample timing subsequent to the given sample timing, where n is an integer ranging from 2 to N−1, with N the number of rows of IC chips in the array of IC chips. The method may further include capturing the readout signals of the array of IC chips at a plurality of successive sample timings in accordance with the sample frequency. The method may yet further include comparing readout signals for one row of IC chips in the pair of non-adjacent rows of IC chips (e.g., the first row of IC chips) (e.g., one readout signal for each IC chip in this row of IC chips) captured at a given sample timing to corresponding readout signals for the other row of IC chips in the pair of non-adjacent rows of IC chips (e.g., the third row of IC chips) (e.g., one readout signal for each IC chip in the third row of IC chips) captured at an m-th sample timing subsequent to the given timing, assuming that the other row of IC chips in the pair of non-adjacent rows of IC chips is the m-th row of IC chips from the one row of IC chips in the pair of non-adjacent rows of IC chips, counting all intermediate rows of IC chips.

BRIEF DESCRIPTION OF THE SEVERAL VIEWS OF THE DRAWINGS

Example embodiments of the disclosure are explained below with reference to the accompanying drawings, wherein FIG. 1 schematically illustrates an example of a thermal imager according to embodiments of the disclosure, FIG. 2 schematically illustrates an example of an array of IC chips (image sensor) in the thermal imager of FIG. 1, FIG. 3 schematically illustrates an example of a filter assembly in the thermal imager of FIG. 1, FIG. 4 schematically illustrates an example of a satellite according to embodiments of the disclosure that carries the thermal imager of FIG. 1, FIG. 5 schematically illustrates a satellite orbiting Earth that carries the thermal imager, and a field of view of the array of IC chips in the thermal imager.

DETAILED DESCRIPTION

In the following, example embodiments of the disclosure will be described with reference to the appended figures. Identical elements in the figures may be indicated by identical reference numbers, and repeated description thereof may be omitted.

Design constraints on actively cooled thermal imagers (e.g., IR cameras) hamper use of such thermal imagers in small (nano)satellites. Uncooled thermal imagers up to now are suitable for short distances only and do not deliver the necessary performance for measuring the temperature of Earth's surface from space with acceptable resolution. One approach for addressing this issue would be to use larger satellites (e.g., a 6 U Cubesat instead of a 3 U Cubesat), to be able to generate the required power for cooling and to discharge the generated heat.

The present disclosure follows another approach. Broadly speaking, the present disclosure proposes to use thermopile arrays for building a thermal imaging element (image sensor or camera sensor) of a thermal imager.

A thermopile is an electronic device that converts thermal energy into electrical energy. It is typically composed of several thermocouples connected in series or in parallel. A thermopile array (array of thermopiles) can be arranged on an IC chip that can serve as an imaging IC (camera IC) for wavelengths from 1 µm to 50 µm. Advantageously, a thermopile array does not require cooling, but on the downside typically has insufficient resolution and insufficient sensitivity, and is insensitive to specific wavelengths (i.e., reacts in similar manner to the whole thermal spectrum).

The present disclosure relates to a thermal imager that comprises an array of thermopile arrays (e.g., an array of IC chips, each IC chips comprising a respective thermopile array) together with a filter assembly for enabling a distinction between different wavelength ranges of incoming (thermal) radiation. A dedicated algorithm may be used for generating a two-dimensional (e.g., quadratic) image from the readout signals of the array of IC chips (array of thermopile arrays).

Figure 1:
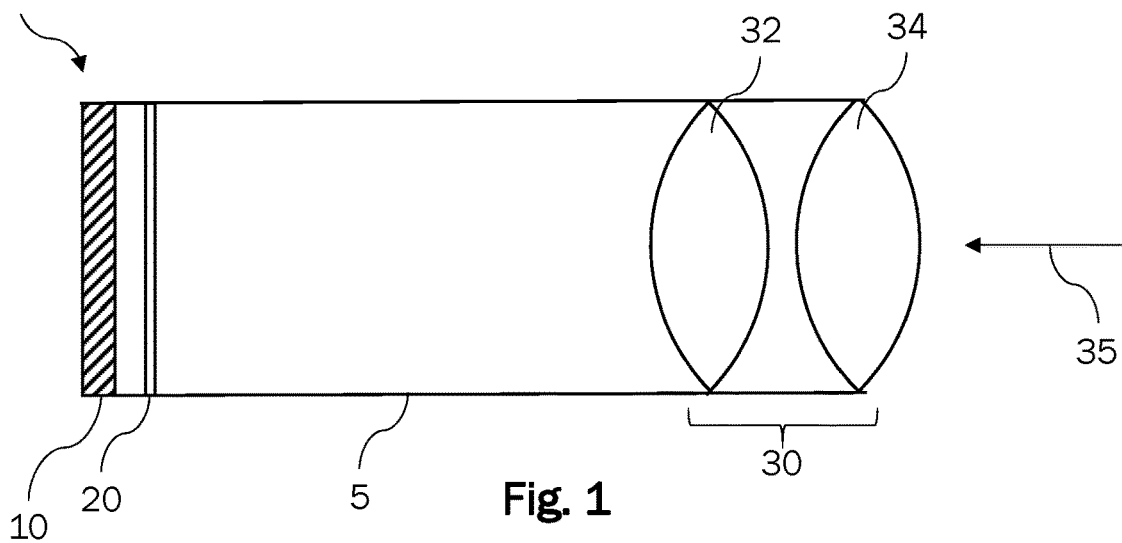

FIG. 1 schematically illustrates an example of a thermal imager 1 (e.g., IR camera) according to embodiments of the disclosure. The thermal imager 1 may be suitable for use in at least one of a satellite, an airplane, or an unmanned aerial vehicle. The satellite may be a nanosatellite, such as a Cubesat (e.g., a 3 U Cubesat) for example.

The thermal imager 1 comprises a lens assembly 30. In the present example, the lens assembly 30 comprises a first lens 32 and a second lens 34, but higher numbers of lenses are feasible as well. The lens assembly 30 is arranged at an opening of the thermal imager 1 (e.g., at an opening of a housing 5 of the thermal imager 1), to allow electromagnetic radiation 35 (e.g., thermal radiation) to pass through the lens assembly 30. The lenses of the lens assembly may be coated to have a passband in der IR range (e.g., in the range of 8 µm-12 µm, or optionally, in the range from 3-13 µm, or, optionally, in any other range). In general, the lens assembly 30 has an associated wavelength of radiation that may pass through the lens assembly 30.

The thermal imager 1 further comprises an image sensor 10 (camera sensor) that is arranged in a field of view of the lens assembly 30. The image sensor 10 is formed by an array of IC chips 11. Each IC chip 11 comprises an array of thermopile devices. As such, the image sensor may be said to be formed by an array of arrays of thermopile devices.

The thermal imager 1 yet further comprises a filter assembly 20 that is arranged between the lens assembly 30 and the image sensor 10 (array of IC chips). The filter assembly 20 is arranged at a predetermined distance from the image sensor 10 (e.g., within a range of 1 mm to 10 mm), without contacting the image sensor 10 (i.e., without contacting the IC chips 11 of the image sensor 10). The filter assembly 20 comprises one or more wavelength filters. Each wavelength filter may be a bandpass filter, for example. In particular, each wavelength filter may be nontransparent in a portion of the wavelength range of radiation that can pass through the lens assembly 30. The purpose of the filter assembly 20 is to allow a distinction between different wavelengths or wavelength ranges, even though thermopile devices are used in the image sensor 10.

Figure 2:
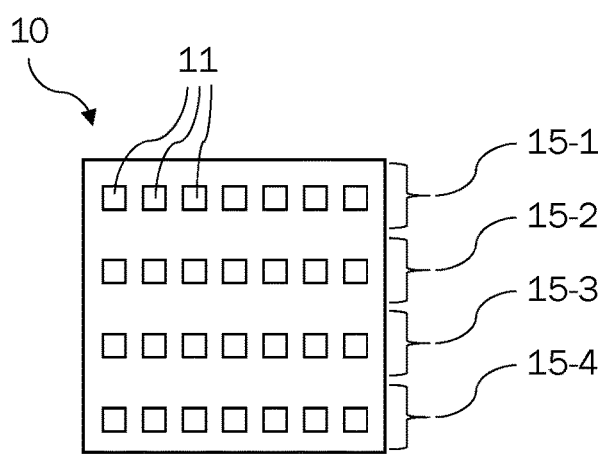

FIG. 2 schematically illustrates an example of the image sensor 10 (array of IC chips) in the thermal imager 1 of FIG. 1. In the array of IC chips, the IC chips 11 are arranged in three or more parallel rows 15-1, 15-2, 15-3, 15-4 of IC chips. In a preferred embodiment, the array of IC chips 11 comprises four rows of IC chips, as illustrated in the example of FIG. 2. The rows 15 of IC chips may be equidistant (i.e., have uniform inter-row spacing). Moreover, the IC chips 11 within each row may be equidistant. For example, the IC chips 11 in the array of IC chips can be arranged at the vertices of a regular rectangular grid. The overall shape of the image sensor 10 can be rectangular (e.g., quadratic) or circular. For a circular shape, the rows 15 of IC chips may have different lengths (in terms of a number of IC chips 11). In general, the number of IC chips 11 per row 15 can differ from row to row and may be different from an overall number of rows 15 in the array of IC chips.

In the most general case, the array of IC chips comprises three or more rows 15 of IC chips, among them a pair of non-adjacent rows of IC chips and one or more rows of IC chips other than the pair of non-adjacent rows of IC chips. The pair of rows may be the outer rows of the array of IC chips (e.g., rows 15-1 and 15-4 in the example of FIG. 2). These rows are spaced apart by at least one row of IC chips (e.g., by two rows of IC chips in the example of FIG. 2). The one or more rows of IC chips other than the pair of non-adjacent rows of IC chips may be the intermediate (or inner) rows of the array of IC chips (e.g., rows 15-2 and 15-3 in the example of FIG. 2).

In an example of this case, the three or more rows 15 of IC chips include first to third rows of IC chips (and possibly, additional rows of IC chips). Therein, the second row of IC chips is arranged at an intermediate position between the first and third rows of IC chips. That is, the first and third rows of IC chips are spaced apart by at least one row of IC chips. The first and third rows may be the outer rows of the array of IC chips. The second row of IC chips is an (or the) intermediate (or inner) row of IC chips.

In a more specific example, the array of IC chips further includes a fourth row of IC chips that is also arranged at an intermediate position between the first and third rows of IC chips. In this case, the first and third rows of IC chips are spaced apart by at least two rows of IC chips. The first and third rows may be the outer rows of the array of IC chips. The second and fourth rows of IC chips are intermediate (or inner) row of IC chips.

Referring again to FIG. 2, row 15-1 may be the first row of IC chips, row 15-4 may be the third row of IC chips, and rows 15-2, 15-3 may be the second and fourth rows of IC chips (or vice versa).

Figure 3:
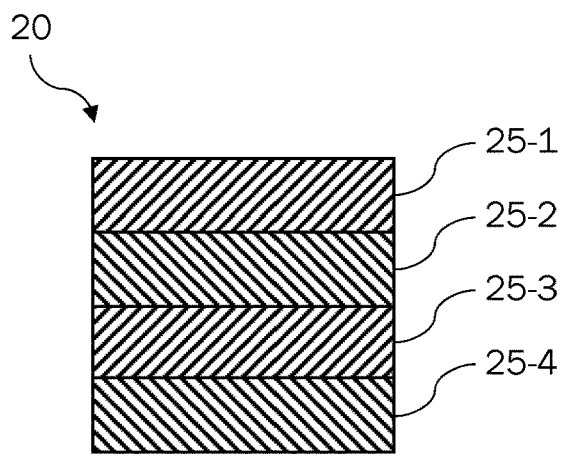

FIG. 3 schematically illustrates an example of a filter assembly 20 in the thermal imager 1 of FIG. 1. The filter assembly 20 comprises one or more wavelength filters.

As is shown in the figure, the filter assembly 20 comprises a plurality of slots 25-1, 25-2, 25-3, 25-4, at each of which a respective wavelength filter can be provided. The slots 25 are (spatially) aligned with respective rows 15 of IC chips, so that a wavelength filter that is provided at a given slot is (spatially) aligned with a corresponding row 15 of IC chips. Here, a wavelength filter being (spatially) aligned with a respective corresponding row 15 of IC chips means that the wavelength filter substantially covers only the corresponding row 15 of IC chips, when seen from the lens assembly 30. That is, each wavelength filter filters radiation that is incident on the respective corresponding row 15 of IC chips, but does not filter radiation that is incident on neighboring rows 15 of IC chips.

In the most general case, the filter assembly 20 comprises a respective wavelength filter for at least one of the rows of IC chips (e.g., for at least one of the first to third rows of IC chips). The wavelength filter(s) are arranged at respective slots that correspond to the at least one of the rows of IC chips. Moreover, the filter assembly 20 is configured such that a wavelength range of (thermal) radiation that can pass to one row of IC chips in the pair of non-adjacent rows of IC chips (e.g., the first row of IC chips) is (substantially) the same as a wavelength range of (thermal) radiation that can pass to the other row of IC chips in the pair of non-adjacent rows of IC chips (e.g., the third row of IC chips). This wavelength range on the other hand is different from a wavelength range of radiation that can pass to (any of) the one or more rows of IC chips other than the pair of non-adjacent rows of IC chips (e.g., the second row of IC chips that is arranged at the intermediate position between the first and third rows of IC chips). In some embodiments, the wavelength range for the pair of non-adjacent rows of IC chips (e.g., the first and third rows of IC chips) may be wider than the wavelength range for the one or more rows of IC chips other than the pair of non-adjacent rows of IC chips (e.g., the second row of IC chips). For example, the wavelength range(s) of radiation that can pass to the one or more rows of IC chips other than the pair of non-adjacent rows of IC chips may be fully included in the wavelength range of radiation that can pass to the pair of non-adjacent rows of IC chips.

For instance, the filter assembly 20 may comprise a respective wavelength filter for the one or more rows of IC chips other than the pair of non-adjacent rows of IC chips (e.g., the second row of IC chips), so that the one or more rows of IC chips other than the pair of non-adjacent rows of IC chips receive filtered (thermal) radiation, whereas the filter assembly 20 does not comprise respective wavelength filters for the pair of non-adjacent rows of IC chips (e.g., the first and third rows of IC chips) (empty slots 25), so that the (thermal) radiation that may pass to the pair of non-adjacent rows of IC chips is not filtered by the filter assembly 20. Instead of omitting wavelength filters for the pair of non-adjacent rows of IC chips, the filter assembly 20 may comprise respective wavelength filters that are fully transparent in the wavelength range of radiation that can pass through the lens assembly 30. In any case, in this example the wavelength range of the radiation that can pass to the pair of non-adjacent rows of IC chips is not further narrowed by the filter assembly 20 compared to a full wavelength range, which is the wavelength range of the radiation that can pass through the lens assembly 30 (or the wavelength range in which Earth's atmosphere is transparent to thermal radiation, e.g., 8 µm to 12 µm as well as 4±0.5 µm). As such, the wavelength range of the radiation that can pass to the pair of non-adjacent rows of IC chips spans the full wavelength range of the radiation. In general, the full wavelength range may be defined as the possible wavelength range of (thermal) radiation that can pass both the atmosphere and the lens assembly 30.

Accordingly, the wavelength range(s) of radiation that can pass to the one or more rows of IC chips other than the pair of non-adjacent rows of IC chips (e.g., the second row of IC chips) is/are narrower than the wavelength range of radiation that can pass to the pair of non-adjacent rows of IC chips (e.g., the first and third rows of IC chips). For example, the width of the wavelength range of the radiation that can pass to the pair of non-adjacent rows of IC chips may be at least 150 percent of (e.g., at least twice) the width of the wavelength range of radiation that can pass to (any of) the one or more rows of IC chips other than the pair of non-adjacent rows of IC chips. Further, the wavelength range of radiation that can pass to the pair of non-adjacent rows of IC chips may span at least two thirds (e.g., at least 90 percent) of the wavelength range of radiation that can pass through the lens assembly 30 (or of the wavelength range in which the atmosphere is transparent to thermal radiation).

In an alternative example, the pair of non-adjacent rows of IC chips (e.g., the first and third rows of IC chips) may have corresponding (substantially identical) wavelength filters in the filter assembly 20, whereas the one or more rows of IC chips other than the pair of non-adjacent rows of IC chips (e.g., the second row of IC chips) receive radiation that is not further filtered by the filter assembly 20 (e.g., no filter in the filter assembly 20 for the second row of IC chips).

In the case in which the array of IC chips comprises four rows of IC chips (e.g., the first to fourth rows of IC chips), the filter assembly 20 may comprise respective wavelength filters for the intermediate (or inner) two rows of IC chips (e.g., the second and fourth rows of IC chips), whereas radiation that can pass to the outer rows of IC chips (e.g., the first and third rows of IC chips) is not filtered by the filter assembly 20. Then, it is preferable that the wavelength ranges of (thermal) radiation that can pass through the wavelength filters for the intermediate rows of IC chips are different from each other (this may be true also in the most general case). For example, these wavelength ranges may be disjoint. The wavelength ranges for the intermediate rows of IC chips may be selected in accordance with requirements of the respective application (e.g., meteorological application or fire detection). For example, the wavelength ranges for the inner rows of IC chips may be selected to allow for a calculation of the temperature on the Earth surface.

In one example in which the filter assembly comprises respective wavelength filters for the two inner rows of IC chips (e.g., the second and fourth rows of IC chips), one of the wavelength filters may be transparent (i.e., may have a passband) in the wavelength range from 8 µm to 10 µm (blocking other wavelengths in the 8 µm to 12 µm range), and the other wavelength filter may be transparent in the wavelength range from 10 µm to 12 µm (blocking other wavelengths in the 8 µm to 12 µm range).

In general, the wavelength range of (thermal) radiation that can pass through the lens assembly (e.g., the wavelength range from 3.5 µm to 13 µm or 8 µm to 12 µm) may be partitioned by the wavelength filters of the filter assembly 20.

In the preferred embodiment, the array of IC chips comprises four rows of IC chips. The corresponding filter assembly 20 comprises respective wavelength filters for the two intermediate (or inner) rows of IC chips that are arranged in the middle (slots 25-2 and 25-3 in FIG. 2), whereas (thermal) radiation that can pass to the outer two rows of IC chips is not (substantially) filtered by the filter assembly 20 compared to the full wavelength range (e.g., 8 µm to 12 µm). Accordingly, the outer two slots of the four-slot filter assembly 30 (slots 25-1 and 25-4 in FIG. 2) may be empty (no filter). The wavelength filters for the rows of IC chips that are arranged in the middle (slots 25-2 and 25-3) may be different from each other. In particular, their passbands may be disjoint, for example so as to partition the full wavelength range (e.g., into equal halves).

In the thermal imager 1 according to the present disclosure, there are always two rows of IC chips that are spaced apart by at least one intermediate row of IC chips (e.g., the pair of outer rows, or the first and third rows of IC chips) and that receive (thermal) radiation in the same wavelength range. As will be detailed below, this allows to compare the readout signals (thermal images) for these two rows of IC chips if the readout signals (thermal images) are captured at appropriately shifted sample timings. Since for appropriately shifted sample timings these readout signals (thermal images) relate to the same portion (pixel) of Earth's surface, captured at different timings, and hence from different angles, this allows to apply stereoscopy for inferring properties of the atmosphere above said portion of Earth's surface. Moreover, in the thermal imager 1 according to the present disclosure, there are always pairs of rows of IC chips that receive (thermal) radiation in different wavelength ranges. By comparing readout signals (thermal images) of these pairs of rows captured at appropriately shifted sample timings, information can be obtained about a thermal image in a wavelength range that is obtained by subtracting the wavelength range of one row in the pair from the wavelength range of the other row in the pair. Likewise, comparing readout signals (thermal images) corresponding to the same portion of Earth's surface but captured in different wavelength ranges allows to infer the actual temperature of said portion of Earth's surface.

Finally, the array of IC chips of the thermal imager 1 allows to construct two-dimensional (e.g., quadratic) thermal images of Earth's surface. In particular, two-dimensional images of the same portion of Earth's surface, but viewed from different angles, can be obtained by appropriate combination of the readout signals (thermal images) captured by the rows of IC chips. By applying stereoscopic methods to these two-dimensional thermal images, additional information can be inferred, for example relating to a three-dimensional shape of clouds in the field of view of the thermal imager 1.

In consequence, by jointly analyzing readout signals (thermal images) captured from different rows of IC chips, possibly captured at appropriately shifted sample timings, additional information can be inferred that allows to more than compensate for the limited thermal resolution of the thermopile array IC chips in the image sensor 10.

In the preferred embodiment, the proposed thermal imager 1 allows to measure thermal radiation at two different wavelengths (the two intermediate (or inner) rows, e.g., the second and fourth rows of IC chips), which is necessary for a numerical correction of the emissivity from Earth's surface or from clouds. In addition, it allows to correct for atmospheric disturbances by the two-angles method (e.g., stereoscopic method) using the first and third rows of IC chips.

Figure 4:
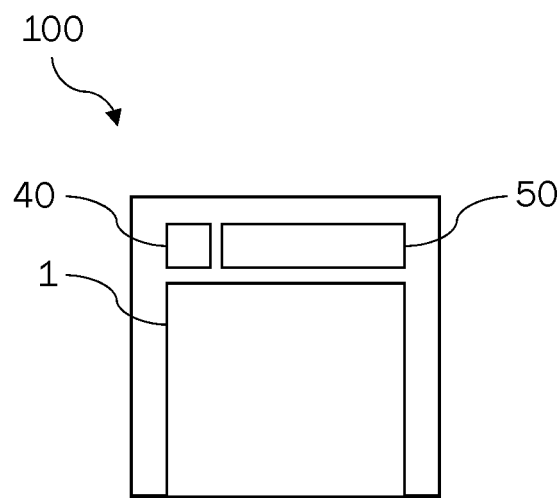

FIG. 4 schematically illustrates an example of a satellite 100 that comprises (e.g., carries/houses) a thermal imager, for example the thermal imager 1 (IR camera) of FIG. 1. The satellite 100 may be an Earth observation satellite, in particular a meteorological satellite. Moreover, the satellite 100 may be a nanosatellite, such as a Cubesat (e.g., a 3 U Cubesat), for example.

In addition to the thermal imager 1, the satellite 100 comprises readout circuitry 40, and optionally, control circuitry 50 for controlling operation of the satellite 100. The readout circuitry 40 may be configured to capture readout signals (thermal images) from the array of IC chips at respective sample timings that are dictated by a sample frequency.

Figure 5:
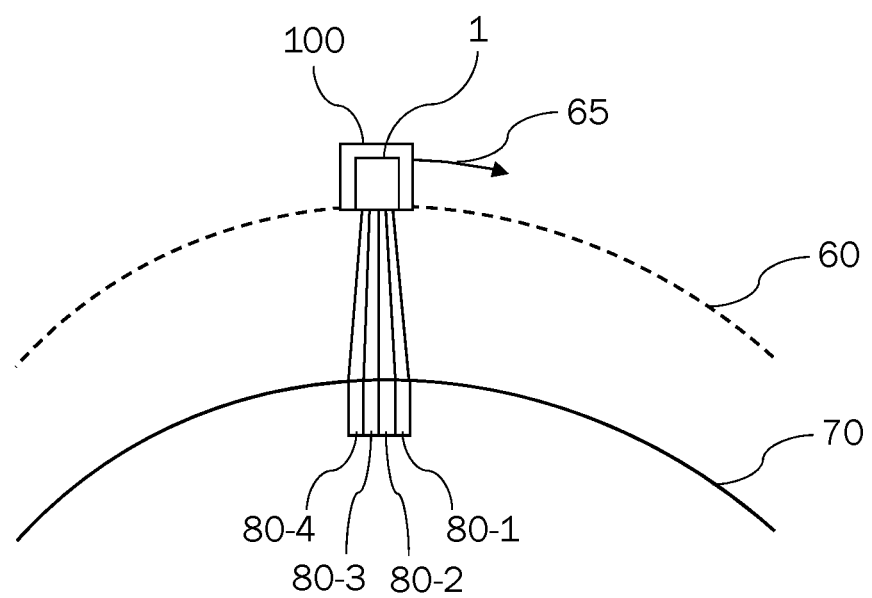

FIG. 5 schematically illustrates a field of view of the array of IC chips (image sensor 10) when the thermal imager 1 is carried by a satellite 100 orbiting Earth. The satellite may be the satellite 100 of FIG. 4.

The satellite 100 moves on an orbit 60 (e.g., low Earth orbit (LEO)) around Earth with a (tangential) direction of movement 65. The satellite 100 may circle Earth with an orbital period T (e.g., about 90 minutes for a LEO).

The thermal imager 1 is arranged within the satellite 100 so that it faces Earth's surface 70. In particular, the thermal imager 1 and/or the satellite 100 may be arranged or oriented so that a main optical axis (observation direction) of the thermal imager 1 is (substantially) perpendicular to Earth's surface 70. The image sensor 10 (array of IC chips) is oriented in a tangential plane on the orbit 60, i.e., in a plane with a surface normal pointing towards the center of the Earth. Each of the rows 15 of IC chips is oriented in perpendicular to a plane spanned by the flight direction 65 of the satellite and a perpendicular to Earth's surface (i.e., the observation direction). With this orientation of the rows 15 of IC chips, a pixel on a ground track of the satellite 100 is successively swept by fields of view of the rows 15 of IC chips, from a leading row to a trailing row. The example of FIG. 5 assumes four rows 15 of IC chips, with corresponding fields of view 80-1, 80-2, 80-3, 80-4 projected on Earth's surface 70. Each field of view 80 projected on Earth's surface 70 has the shape of a rectangle. The lengths L of these fields of view 80 along a ground track of the satellite 100 may be equal. The length L may define a spatial resolution along the ground track. A square unit of area L×L may be referred to as a pixel. Each of these pixels may correspond to a respective IC chip.

Given this configuration, a sample frequency f for capturing readout signals (thermal images) from the array of IC chips is set in dependence on an orbital period T of the satellite 100 and the length L (along the ground track) of the field of view of each row of IC chips projected on Earth's surface. In particular, the sample frequency for capturing readout signals of the array of IC chips may be set such that a field of view, projected on Earth's surface, of the leading row of IC chips at a given sample timing substantially coincides with a field of view, projected on Earth's surface, of an n-th row of IC chips from the leading row of IC chips at an n-th sample timing subsequent to the given sample timing, where n is an integer ranging from 2 to N−1, with N the number of rows 15 of IC chips in the array of IC chips. Then, the field of view of the leading row at a given sample timing is the same as the field of view of the next-to-leading row at the next sample timing, and so forth. Thereby, a pixel on the ground track of the satellite 100 is successively captured by each row of IC chips within the array of IC chips, from the leading row to the trailing row. If R is the (mean) Earth radius for the ground track of the satellite 100 on orbit 60, the sample frequency f may be given by $f=(2 \cdot R \cdot \pi)/(L \cdot T)$.

This choice of the sample frequency f makes the captured field of view of a given row of IC chips comparable to the captured fields of view of its neighboring rows at appropriately shifted sample timings. Thereby, by taking differences between readout signals for a given pixel or field of view projected on Earth's surface that correspond to different rows of IC chips, information about wavelength ranges that relate to differences between wavelength ranges can be obtained. This assumes that the involved wavelength ranges have full overlap, i.e., one is fully included in the other. For instance, if readout signals for a given field of view on ground are available for 8 μm to 12 μm and for 10 μm to 12 μm, a readout signal for 8 μm to 10 μm can be obtained by taking an appropriate difference between the two readout signals.

In the above, appropriately shifted sample timings are understood to be shifted by integer multiples of a sample period $t=1/f$ with the sample frequency f. For two different rows of IC chips, one being the $n_1$-th row from the leading row and the other being the $n_2$-th row from the leading row, the sample timings would have to be shifted by $\Delta t=(n_2-n_1) \cdot t$. For instance, for four rows of IC chips in the array of IC chips, sample timings for the outer rows of IC chips would have to be shifted by $\Delta t=3 \cdot t=3/f$ so that the thermal images captured by these rows of IC chips relate to the same field of view on ground, and thus are comparable to each other.

In the thermal imager 1 according to the present disclosure, there are always two rows of IC chips that are spaced apart by at least one intermediate row of IC chips (e.g., the outer two rows, or the first and third rows of IC chips) and that receive (thermal) radiation in the same wavelength range. If the readout signals (thermal images) for these rows of IC chips are captured at appropriately shifted sample timings, these readout signals (thermal images) relate to the same portion of Earth's surface, captured at different timings, and hence from different angles. This allows for applying stereoscopy for inferring properties of the atmosphere above said portion of Earth's surface. Moreover, in the thermal imager 1 according to the present disclosure, there are always pairs of rows of IC chips that receive (thermal) radiation in different wavelength ranges. By comparing readout signals (thermal images) of these pairs of rows captured at appropriately shifted sample timings, information can be obtained about a thermal image in a wavelength range that is obtained by subtracting the wavelength range of one row in the pair from the wavelength range of the other row in the pair. Likewise, comparing readout signals (thermal images) corresponding to the same portion of Earth's surface but captured in different wavelength ranges allows to infer the actual temperature of said portion of Earth's surface.

Finally, the array of IC chips of the thermal imager 1 allows to construct two-dimensional (thermal) images of Earth's surface. In particular, two-dimensional images of the same portion of Earth's surface, but viewed from different angles can be obtained by appropriate combination of the readout signals (thermal images) captured by the rows of IC chips. By applying stereoscopic methods to these two-dimensional (thermal) images, additional information can be inferred, for example on a three-dimensional shape of clouds in the field of view of the thermal imager 1 aboard the satellite 100.

Accordingly, the readout circuitry 40 of the satellite 100 may be configured to compare readout signals for a given row of IC chips (e.g., the one row in the pair of non-adjacent rows of IC chips, or the first row of IC chips in the example described above) captured at a given sample timing to corresponding readout signals for another row of IC chips (e.g., the other row in the pair of non-adjacent rows of IC chips, or the third row of IC chips in the example described above) captured at an appropriately shifted sample timing (e.g., an m-th sample timing subsequent to the given timing, assuming that the other row in the pair on non-adjacent rows of IC chips is the m-th row of IC chips from the one row in the pair of non-adjacent pairs of IC chips, counting all intermediate rows of IC chips).

Returning to the above example in which the three or more rows of IC chips include the first to third rows of IC chips, the first row of IC chips may be the leading row and the third row of IC chips may be the trailing row. The second row (and optionally, the fourth row) are arranged between the leading and trailing rows. Assuming that the array of IC chips includes N rows in total (e.g., N=4 in the preferred embodiment), the readout signals for the first row of IC chips can be compared to the readout signals of the third row of IC chips, for example for a stereoscopic analysis, if the latter are obtained three sample periods later.

Figure 6:
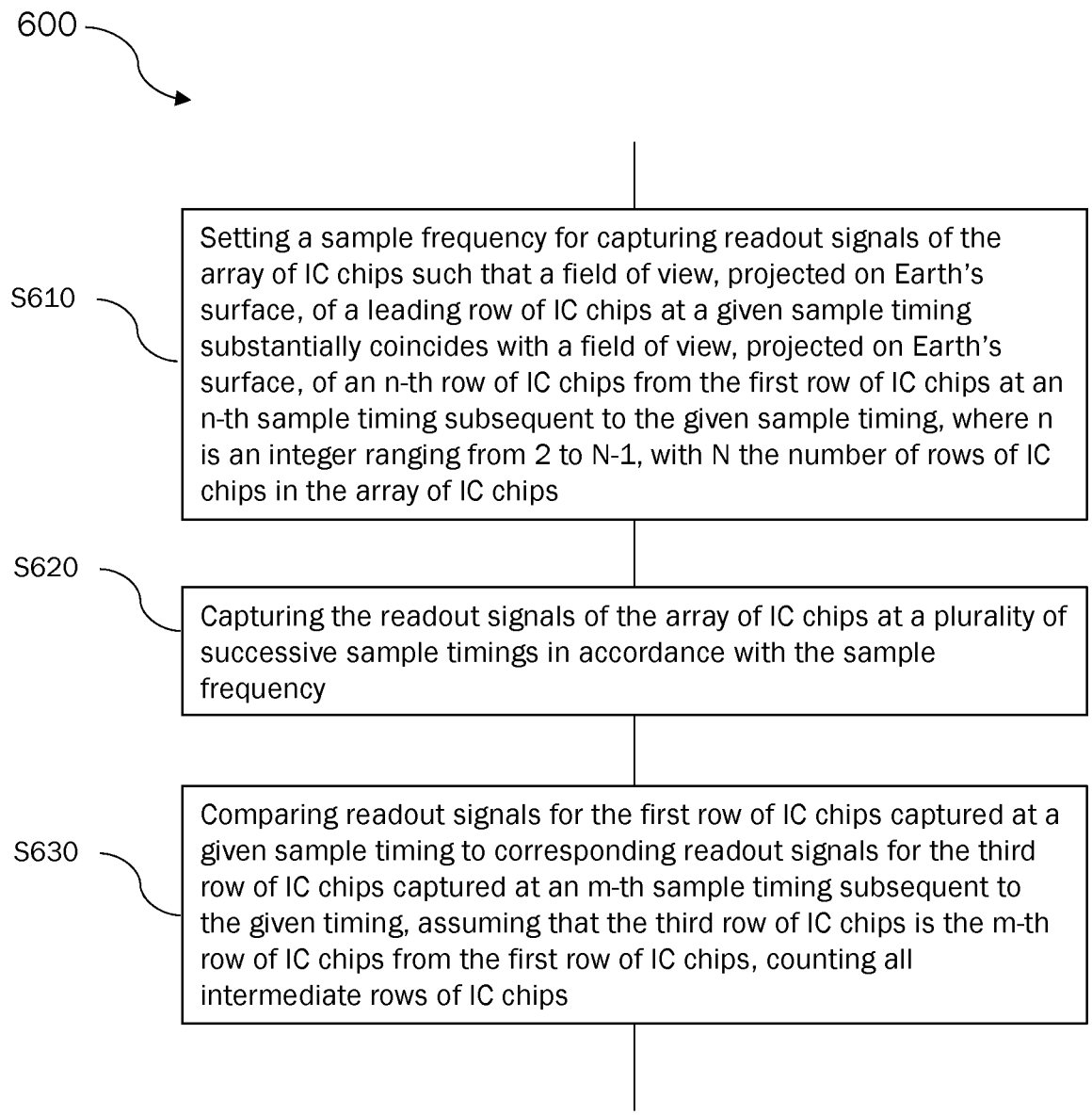
FIG. 6 is a flowchart schematically illustrating a method of operating a thermal imager according to embodiments of the disclosure when carried by a satellite orbiting Earth.

FIG. 6 is a flowchart schematically illustrating a method 600 of operating the thermal imager 1 when aboard a satellite orbiting Earth, assuming that the thermal imager is arranged such that it faces Earth's surface and the rows of IC chips are oriented in perpendicular to a plane spanned by a flight direction of the satellite and a perpendicular to Earth's surface. The method may be performed by the readout circuitry 40, for example. The method comprises, at step S610, setting a sample frequency for capturing readout signals of the array of IC chips such that a field of view, projected on Earth's surface, of a leading row of IC chips at a given sample timing substantially coincides with a field of view, projected on Earth's surface, of an n-th row of IC chips from the first row of IC chips at an n-th sample timing subsequent to the given sample timing, where n is an integer ranging from 2 to N−1, with N the number of rows of IC chips in the array of IC chips. This sample frequency f may be calculated as stated above, for example.

At step S620, the readout signals of the array of IC chips are captured at a plurality of successive sample timings in accordance with the sample frequency. That is, the successive sample timings may be spaced apart, in time, by 1/f from one another.

Finally, at step S630, readout signals for one row in the pair of non-adjacent rows of IC chips (e.g., the first row of IC chips) captured at a given sample timing are compared to corresponding readout signals for the other row in the pair of non-adjacent rows of IC chips (e.g., the third row of IC chips) captured at an m-th sample timing subsequent to the given timing, assuming that the other row in the pair of non-adjacent rows of IC chips is the m-th row of IC chips from the one row in the pair of non-adjacent rows of IC chips, counting all intermediate rows of IC chips. In general, the method may comprise comparing the readout signals (thermal image) of any row of IC chips captured at a given sample timing to the readout signals of any other row of IC chips at an appropriately shifted sample timing (i.e., shifted by an integer multiple of 1/f). If the wavelength ranges of (thermal) radiation that can reach the respective rows of IC chips are identical, this enables a stereoscopic analysis. If the wavelength ranges are different, this enables inferring readout signals for the respective field of view projected on ground at new (difference) wavelength ranges, as noted above. Preferably, the readout signals for the outer two rows (i.e., the leading row and the trailing row) are compared to each other.

It should be noted that the features of the thermal imager or satellite described above may correspond to respective method features (of, e.g., a manufacturing method or operating method) that may not be explicitly described, for reasons of conciseness, and vice versa. The disclosure of the present document is considered to extend also to such methods and vice versa.

It should further be noted that the description and drawings merely illustrate the principles of the proposed antenna. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method and system. Furthermore, all statements herein providing principles, aspects, and embodiments of the invention, as well as specific examples thereof, are intended to encompass equivalents thereof.

The invention claimed is:

1. A thermal imager, comprising:
a lens assembly;
an array of integrated circuit (IC) chips that is arranged in a field of view of the lens assembly, each IC chip comprising an array of thermopile devices; and
a filter assembly comprising one or more wavelength filters,
wherein the IC chips are arranged in three or more parallel rows of IC chips that include a pair of non-adjacent rows of IC chips and one or more rows of IC chips other than the pair of non-adjacent rows of IC chips;
wherein the filter assembly is arranged between the array of IC chips and the lens assembly and comprises a respective wavelength filter for at least one of the three or more rows of IC chips, wherein the at least one wavelength filter is transparent in a portion of a wavelength range of radiation that can pass through the lens assembly; and
wherein the filter assembly is further configured such that radiation of the same wavelength range can pass to the rows of IC chips in the pair of non-adjacent rows of IC chips, and such that the wavelength range of radiation that can pass to the rows of IC chips in the pair of non-adjacent rows of IC chips is different from a wavelength range of radiation that can pass to the one or more rows of IC chips other than the pair of non-adjacent rows of IC chips.

2. The thermal imager according to claim 1, wherein the wavelength range of radiation that can pass to the rows of IC chips in the pair of non-adjacent rows of IC chips spans at least two thirds of the wavelength range of radiation that can pass through the lens assembly.

3. The thermal imager according to claim 1, wherein the wavelength range of radiation that can pass to the rows of IC chips in the pair of non-adjacent rows of IC chips is larger than the wavelength range of radiation that can pass to the one or more rows of IC chips other than the pair of non-adjacent rows of IC chips by at least 50 percent.

4. The thermal imager according to claim 1, wherein the wavelength range of radiation that can pass to the rows of IC chips in the pair of non-adjacent rows of IC chips spans the full wavelength range of radiation that can pass through the lens assembly.

5. The thermal imager according to claim 1, wherein the array of IC chips includes at least two inner rows of IC chips that are arranged at respective intermediate positions between the rows of IC chips in the pair of non-adjacent rows of IC chips;
wherein the filter assembly comprises a respective wavelength filter for each of the at least two inner rows of IC chips; and
wherein wavelength ranges of radiation that can pass through the respective wavelength filters for the at least two inner rows of IC chips are different from each other.

6. The thermal imager according to claim 1, wherein a wavelength range of radiation that can pass through the lens assembly is partitioned by the wavelength filters of the filter assembly.

7. The thermal imager according to claim 1, wherein the array of IC chips is a rectangular or circular array.

8. The thermal imager according to claim 1, wherein the filter assembly is arranged at a predetermined distance from the array of IC chips.

9. The thermal imager according to claim 1, wherein the thermal imager is suitable for use in at least one of a satellite, an airplane, or an unmanned aerial vehicle.

10. A satellite comprising the thermal imager according to claim 1.

11. The satellite according to claim 10, wherein the thermal imager is arranged such that it faces Earth's surface and the rows of IC chips are oriented in perpendicular to a plane spanned by a flight direction of the satellite and a perpendicular to Earth's surface.

12. The satellite according to claim 10, wherein a sample frequency for capturing readout signals of the array of IC chips is set in dependence on an orbital period of the satellite and a length along a ground track of the satellite of a field of view, projected on Earth's surface, of each row of IC chips.

13. The satellite according to claim 10, wherein a sample frequency for capturing readout signals of the array of IC chips is set such that a field of view, projected on Earth's surface, of a leading row of IC chips at a given sample timing substantially coincides with a field of view, projected on Earth's surface, of an n-th row of IC chips from the leading row of IC chips at an n-th sample timing subsequent to the given sample timing, where n is an integer ranging from 2 to N−1, with N being the number of rows of IC chips in the array of IC chips.

14. The satellite according to claim 13, further comprising readout circuitry for capturing the readout signals of the array of IC chips at respective sample timings given by the sample frequency,
wherein the readout circuitry is configured to compare readout signals for one row of IC chips in the pair of non-adjacent rows of IC chips captured at a given sample timing to corresponding readout signals for the other row of IC chips in the pair of non-adjacent rows of IC chips captured at an m-th sample timing subsequent to the given timing, assuming that the other row of IC chips in the pair of non-adjacent rows of IC chips is the m-th row of IC chips from the one row of IC chips in the pair of non-adjacent rows of IC chips, counting all intermediate rows of IC chips.

15. A method of operating the thermal imager according to claim 1 when aboard a satellite orbiting Earth, when the thermal imager is arranged such that it faces Earth's surface and the rows of IC chips are oriented in perpendicular to a plane spanned by a flight direction of the satellite and a perpendicular to Earth's surface, the method comprising:
setting a sample frequency for capturing readout signals of the array of IC chips such that a field of view, projected on Earth's surface, of a leading row of IC chips at a given sample timing substantially coincides with a field of view, projected on Earth's surface, of an n-th row of IC chips from the leading row of IC chips at an n-th sample timing subsequent to the given sample timing, where n is an integer ranging from 2 to N−1, with N being the number of rows of IC chips in the array of IC chips;
capturing the readout signals of the array of IC chips at a plurality of successive sample timings in accordance with the sample frequency; and
comparing readout signals for one row of IC chips in the pair of non-adjacent rows of IC chips captured at a given sample timing to corresponding readout signals for the other row of IC chips in the pair of non-adjacent rows of IC chips captured at an m-th sample timing subsequent to the given timing, assuming that the other row of IC chips in the pair of non-adjacent rows of IC chips is the m-th row of IC chips from the one row of IC chips in the pair of non-adjacent rows of IC chips, counting all intermediate rows of IC chips.

* * * * *